Feb. 3, 1970 J. COHEN 3,493,767

TUNNEL EMISSION PHOTODETECTOR HAVING A THIN INSULATION LAYER AND A P-TYPE SEMICONDUCTOR LAYER

Filed June 1, 1967

INVENTOR.
JULIUS COHEN

BY Joseph H. Roediger
ATTORNEY.

United States Patent Office 3,493,767
Patented Feb. 3, 1970

3,493,767

TUNNEL EMISSION PHOTODETECTOR HAVING A THIN INSULATION LAYER AND A P-TYPE SEMICONDUCTOR LAYER

Julius Cohen, Brooklyn, N.Y., assignor to General Telephone & Electronics Laboratories Incorporated, a corporation of Delaware Filed June 1, 1967, Ser. No. 642,765
Int. Cl. H01j 39/12; G02f 1/28
U.S. Cl. 250—211 8 Claims

ABSTRACT OF THE DISCLOSURE

A photodetector is described in which metal, insulation barrier and P-type semiconductor layers form a layered structure. An electric field is applied across the structure to initiate tunnelling of carriers through the barrier layer. The incidence of photons having energies greater than the band gap of the P-type semiconductor layer results in an increase in the tunnelling of carriers through the barrier. The sensitivity of the photodetector is determined by the probability of carriers tunnelling through the barrier layer with and without the incidence of photons upon the semiconductor.

Background of the invention

This invention relates to photodetectors and more particularly to a photodetector utilizing photon-assisted tunnel emission.

Light sensitive devices such as imaging tubes and television pick-up tubes convert incident light signals to electrical signals. Generally, these devces utilize a layer of photoconductive material applied to a supporting substrate. The photoconductive effect exhibited by these materials may be defined as the change of electrical conductivity therein in response to variations in the intensity of incident radiation. Thus, it is common to find these devces referred to as photoresistors.

In practice, electrodes are provided for the photoconductive material and a voltage applied thereacross. The conductivity of the material is at its minimum value in the absence of incident radiation. This results in a relatively low "dark" current. When radiation falls on the photoconductive material, the radiation is absorbed and excites carriers from a nonconducting ground state to a higher energy state where these charge carriers are free to contribute to the electrical conductivity. The change in conductivity produces a corresponding change in the magnitude of the current flowing through the photoconductor.

Two materials widely utilized in light sensitive devices are cadmium sulfide and cadmium selenide. In the fabrication of these devices, the photoconductive layer is typically formed either by sintering a powdered layer to effect bonding or embedding the powder in a dielectric medium. The photoconductive properties of a particular device are determined primarily by the composition and geometry of the unit. In this connection, it is recognized that the sensitivity and response time of a unit are interrelated parameters.

The resistance of a photodetector when it is not exposed to incident radiation is required to be relatively high or no significant variation in signal will be detected when the detector is exposed. However, it is known that the response time of the detector is a function of the reciprocal of the resistance. In practice, a compromise is made for a particular device application between sensitivity and response time.

The phenomenon of electrons tunnelling through a barrier layer of insulating material is known to occur essentially instantaneously. This mechanism does not depend on the recombination times of holes and electrons in a particular material. By utilizing this tunnelling effect in photosensitive devices, the relationship between sensitivity and dark resistance present in prior art devices no longer limits the device operating characteristics.

The tunnelling mechanism has been utilized in the field of electro-luminescence for the generation of light at relatively low voltages. Briefly, this type of device utilizes a metal electrode, an electro-luminescence phosphor and and insulating barrier interposed therebetween. The insulating layer permits a potential difference to exist between the phosphor and the metal upon the application of a voltage across the device. As a result, electrons tunnel from the valence band of the phosphor to the metal with holes being formed in the phosphor. The phosphor material contains electrons in the conduction band and is, therefore, N-type material. These electrons drop to the valence band and combine with the holes. This process is termed radiative recombination and results in the emission of light.

Summary of the invention

The present invention is directed to a photodetector which utilizes photon-assisted tunnel emission as the operative mechanism responsive to incident radiation.

A photodetector constructed in accordance with the present invention comprises a body of P-type semiconductor material, an insulator barrier layer formed on one surface of the semiconductor body, a metal layer formed on the barrier layer and means for applying an electric field thereacross. The device utilizes tunnel emission from the semiconductor through the barrier to the metal layer to indicate the presence of incident radiation.

Tunnel emission describes the phenomenon wherein a charge carrier at a particular energy level and located on one side of a barrier is capable of appearing on the other side of the barrier at the same energy level. The transition through the potential barrier is characterized by a probability for charge carriers having a kinetic energy less than the potential energy of the barrier. This probability, referred to herein as the transmission coefficient, is dependent upon the magnitude of the electric field applied across a particular barrier and the height of the barrier.

When a given electric field is applied, the current density is a function of the transmission coefficient. While tunnelling occurs in both directions, the net electron flow is from the semiconductor to the metal when the metal is biased positively since there are many more unoccupied states in the metal. It has been found that this net flow increases significantly when radiation is absorbed in the P-type semiconductor material. This phenomenon is photon-assisted emission and is utilized in the present invention to provide a photodetector having improved sensitivity.

The present photoconductor contains a barrier layer interposed between the P-type semiconductor body and the metal layer. This layer is formed of an insulating material, so that the resistance of the photodetector when unexposed to radiation is relatively high. In addition, the barrier layer is required to be thin so that the transmission coefficient is sufficiently high for practical device applications.

The band gap of the semiconductor material employed is required to be smaller than the energy of the photons incident thereon. This insures that the incident photons, when absorbed in the semiconductor body, increase the number of electrons in the conduction band of the semiconductor. The particular semiconductor material employed is determined by the portion of the frequency spectrum containing the radiation to be detected.

The semiconductor material is P-type material wherein the electrons are intially in the valence band. Consequently, the tunnelling in the absence of incident radiation occurs from the valence band of the semiconductor and the transmission coefficient is determined by the height of the barrier measured from the valence band. The absorption of energy from the incident photons raises electrons in the semiconductor to the conduction band. Thus in the exposed condition, tunnelling occurs from the conduction band which is closer, by an amount equal to the band gap of the material, to the top of the barrier than the valence band. This difference results in an increase in the transmission coefficient when the device is exposed to incident radiation and determines in part the sensitivity of the device. This effect is not believed to occur in devices employing N-type semiconductor since the electrons are already located in the conduction band in the absence of radiation and the tunnelling occurs at the same energy level both with and without the incident photons.

The high resistance in the absence of incident radiation necessary for high sensitivity photodetectors is provided in the present structure by the resistance of the barrier layer. In addition, the resistance of the barrier layer does not significantly affect the response time since tunnelling occurs essentially instantaneously and does not rely on the lifetime of the photoelectrons, which in turn depends on the recombination time in the semiconductor material. Also, the semiconductor material is a low resistance material to insure that a substantial portion of the voltage applied across the structure is developed across the barrier layer.

Further features and advantages of the invention will become more readily apparent from the following detailed description of a specific embodiment when taken in conjuction with the accompanying drawing.

Description of the preferred embodiment

Figure 1:
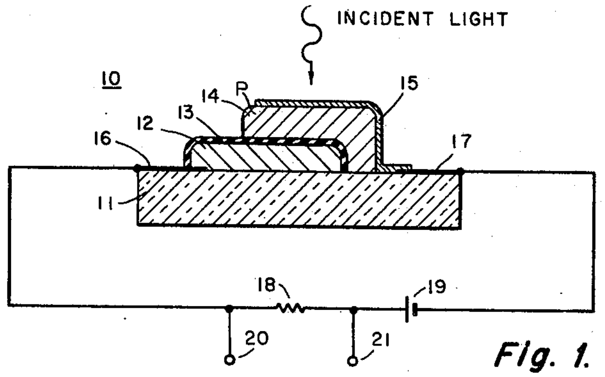
FIG. 1 is a side view in section of one embodiment of the invention.

A photodetector 10 is shown in FIG. 1 as comprising a substrate 11 having a metal layer 12 thereon. A barrier layer 13 is formed on the surface of metal layer 12. Overlying at least a portion of the barrier layer is a body 14 of P-type semiconductor material. The top surface of the semiconductor material is provided with a transparent electrode 15. As shown, metal layer 12 and electrode 15 are connected to corresponding contacts 16 and 17 on the surface of substrate 11.

The substrate 11 is provided for support and may be formed of any suitable insulating material such as glass. While in some applications it may be desirable to eliminate substrate 11 and increase the thickness of metal layer 12, the fabrication of the photodetector is simplified by utilizing a substrate since the component layers of the structure may be formed by conventional evaporation techniques. Also the thickness of layer 12 may be decreased for applications wherein the semiconductor is to be exposed to radiation which first passes through the metal and barrier layers. The barrier layer can be provided by the oxidation of the metal layer prior to the deposition of the semiconductor material.

The metal layer 12 is preferably selected to be a metal such as aluminum, which is readily oxidizable to form the barrier layer 13 thereon. The barrier layer 13 is high resistance film and primarily determines the "dark" resistance of the device. The "dark" resistance of a photodetector determines the magnitude of the current flowing in the absence of incident radiation. Since this current is in effect noise, the signal to noise ratio of the photodetector is dependent on this "dark" resistance. While the oxide of aluminum, $Al_2O_3$, is the preferred barrier material, other suitable barrier materials are SiO, $Cr_2O_3$, AlN, and $Ta_2O_5$.

In addition, the thickness of the insulating layer 13 must be such that tunnelling therethrough will take place. To this end, the thickness of layer 13 should not exceed 150 angstroms. The preferred thickness is found to be within the range of 50 to 100 angstroms. Since the thickness of the barrier layer primarily determines the "dark" resistance of the photodetector, a barrier layer having a thickness of less than about 35 angstroms is undesirable due to its relatively low resistance.

The body of semiconductor material 14 absorbs the incident radiation as shown in FIG. 1. The resistance of this semiconductor body relative to the resistance of he barrier layer 13 determines the portion of the applied voltage that appears cross the barrier. Since as will later be explained the field across the barrier is required to be relatively high, in the approximate range of $10^6$ to $10^7$ volts/centimeter, for the device to operate in its intended manner, the resistance of the semiconductor body 14 should be not larger than one-tenth the resistance of the barrier.

The thickness of the semiconductor body 14 is required to be large enough so that the body is not transparent to the incident radiation. In addition, the body must be thin enough to permit radiation to be absorbed by the semiconductor material proximate to the barrier layer 13. Stated in other words, the thickness of the semiconductor body must be at least as small as the reciprocal of the absorption constant of the material so that appreciable photon absorption occurs within a diffusion length of the semiconductor barrier layer interface. Another condition placed on the semiconductor material employed in the device is that the band gap of the material must be smaller than the energy of the photons incident thereon. This material requirement is necessary so that carriers in the valence band in the semiconductor material can be excited to higher kinetic energy states in the conduction band by the absorption of the incident photons. The relationship is expressed in terms of the wavelength in microns of the incident radiation by the following equation:

$$\text{Band gap} < \frac{1.24}{\eta}$$

The body of P-type semiconductor material employed may comprise either a single crystal film, a polycrystalline film, or polycrystalline bulk material. Materials suitable for use in the present device are tellurium, silicon, gallium arsenide, and antimony. It is to be noted that the material employed is determined with a view to the wavelength of the incident radiation. In fabricating and testing a number of photodetectors designed for operation in the infrared portion of the frequency spectrum, the preferred material was found to be tellurium which has a band gap of about 0.34 ev. The thickness of tellurium was approximately 10,000 angstroms.

While the embodiment of FIG. 1 shows an overlying transparent electrode 15 connected to contact 17, this electrode is not necessary for devices utilizing high conductivity semiconductor material since the electrical resistance to the barrier is relatively low. In practice, an overlying transparent electrode, for example a 100 angstrom layer of gold, is employed only in embodiments utilizing relatively low conductivity semiconductor material. In either case, contacts 16 and 17 are coupled to a load impedance 18 and a supply voltage source 19. The output signal is taken between terminals 20 and 21.

Figure 2A:
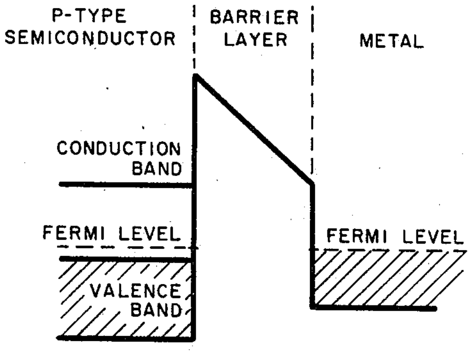
FIGS. 2*a* and 2*b* show representative energy level diagrams of the invention.
Figure 2B:
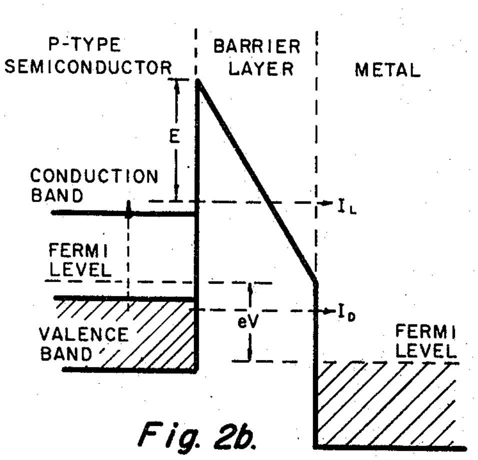

The operation of the device can be best understood by considering the energy level diagrams shown in FIGS. 2*a* and 2*b*. The basis for detection in the present invention is the large increase in the tunnelling probability of carriers through a thin barrier layer when the kinetic energy of the carriers is increased by photon absorption in a body of semiconductor adjacent the barrier.

FIG. 2*a* shows the energy diagram for a structure comprising a P-type semiconductor, a thin barrier layer and a metal with zero voltage applied thereacross. Since the currents on the both sides of the barrier are equal and opposite, no net current flows across the barrier. The situation corresponding to the application of a positive voltage V to the metal is shown in FIG. 2*b*. Again, tunnelling occurs in both directions, but the net electron flow $I_d$ is from the semiconductor to the metal because there are many more unoccupied states in the latter.

When radiation is absorbed in the semiconductor, some of the electrons in the valence band are excited to higher kinetic energy states in the conduction band, and the conduction current $I_L$ increases because of the increase in the transmission coefficient (tunnelling probability). This phenomenon is photon-assisted tunnel emission.

Figure 3:
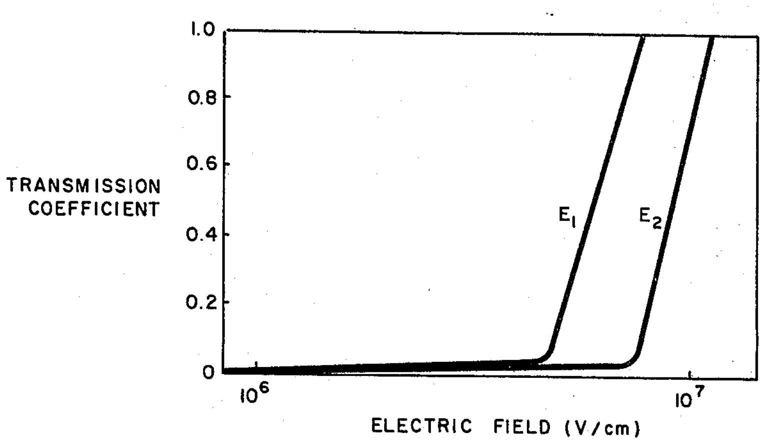
FIG. 3 shows the relationship between the transmission coefficient and electric field from the embodiment of FIG. 1.

The voltage applied across the combination of the semiconductor, barrier and metal provides an electric field across the barrier layer. The transmission coefficient in the absence of incident photons is a function of this electric field and the height E of the barrier as shown in FIG. 3. Although the dependence of the transmission coefficient on the height of the barrier is extremely large at low fields, the coefficients are very small. As a result, the detection of increased tunnelling current due to an increased energy may not possible. On the other hand, if the field is too strong, the transmission coefficient may be unity when the device is not exposed to incident radiation. Thus the device becomes essentially insensitive to incident radiation at fields in excess of $10^7$ volts/cm.

The transmission coefficient D of carriers through a triangular barrier in strong electric fields is expressed for the general case wherein the image force is neglected by the following equation:

$$D=e-\left(\frac{4}{3}\frac{2m}{h}\frac{|E|^{3/2}}{ef}\right)$$

where *m* is the mass of one electron, *h* is Planck's constant *h* divided by $2\pi$, E is the barrier height calculated from the top of the barrier and F is the electric field across the barrier layer. The kinetic energy E is normally within the range of −1 to −3 ev. The limits of this range correspond to curves $E_1$ and $E_2$ of FIG. 3 respectively. As a result the electric field across the barrier is required to be within the range of $10^6$ to $10^7$ volt/cm. The applied voltage required is determined by the thickness of the barrier layer if the resistance of the semiconductor material is neglected. For example, the range of applied voltage is from about 0.5 v. to about 5 v. for a 50 angstrom barrier thickness.

In sereval embodiments formed of a thin film sandwich structure of Te-$Al_2O_3$-Al wherein the top electrode is omitted, the thickness of the P-type Te layer is approximately 10,000 angstroms and the thickness of the $Al_2O_3$ is about 50 angstroms. The tellurium semiconductor material is P type and has a conductivity of about 0.2 1/ohm-cm. at 77° K. The embodiments along with conventional-type tellurium photodetectors were exposed to radiation from a 500° K. black body which was sinusoidally modulated at 500 c.p.s. to produce a detector signal across a load resistor which was measured by a 4 c.p.s. bandwidth amplifier.

The RMS power density of the detector was 4 $\mu$w./cm.$^2$ and the dimensions of the tunnel barrier detectors and the conventional detectors were 3 x 3 mm. and 3 x 4 mm. respectively. The bias current through the sandwich was about $10^{-8}$ amp and the voltage about 1 v. The bias current through the conventional detector was $10^{-5}$ amp. Speed of response measurements were performed on these samples by using square light pulses obtained by mechranically chopping the radiation from a 0.6-w. tungsten incandescent lamp operated at 2400° K.

The results of detectivity and response-time measurements on different samples are listed below in Table I.

TABLE I

| Sample | | Detectivity (cm. cps. ½w $^{-1}$ | Response time ($\mu$ sec.) |
|---|---|---|---|
| 1 | Te photodetector | $1\times10^7$ | 3,000 |
| | Tunnel detector | $2\times10^7$ | 30 |
| 2 | Te photodetector | $1\times10^7$ | 1,000 |
| | Tunnel detector | $1\times10^7$ | 10 |
| 3 | Te photodetector | | |
| | Tunnel detector | $1\times10^7$ | 20 |

It shall be noted that in connection with Sample 3, the Te photodetector was insensitive but when operated as a tunnel photodetector it showed good detectivity and a short response time. The improvement in response times for the different samples is attributed to the fact that photoelectrons generated at the tunnel-barrier interface tunnel through the barrier in a time which is short compared with the lifetime of photo-electrons in tellurium. This mechanism also accounts for the ability of the present device to detect photoelectrons from a normally insensitive material.

While the above description has referred to specific embodiments of the invention, it will be apparent that many variations and modifications may be made therein without departing from the spirit and scope of the invention.

What is claimed is:

1. A photodetector responsive to incident photons comprising:

(a) a body of P-type semiconductor material, said material having a band gap which is at least as small as the energy of said incident photons;

(b) an insulating barrier layer formed on one surface of said body;

(c) a metal layer formed on said insulating layer; and (d) means for applying an electric field across the combination of said body, said insulating layer and said metal layer, said electric field establishing said metal layer at a positive potential with respect to said semiconductor layer, whereby the charge carriers in said P-type semiconductor body are excited to higher energy states by said incident photons and tunnel through said insulating barrier layer.

2. A photodetector in accordance with claim 1 in which the electrical resistance of said insulating layer is at least ten times the electrical resistance of said semiconductor body.

3. A photodetector in accordance with claim 2 in which said barrier layer has a thickness within the range of 35 to 150 angstroms.

4. A photodetector in accordance with claim 3 in which said barrier layer is formed of an insulator selected from the group consisting of $Ta_2O_5$, $Al_2O_3$, SiO, $Cr_2O_3$, and AlN.

5. A photodetector in accordance with claim 4 in which said barrier layer has a thickness within the range of 50 to 100 angstroms and said means applies an electric field within the range of $10^6$ to $10^7$ v./cm. across said barrier layer.

6. A photodetector in accordance with claim 6 in which said body of semiconductor material has a thickness which is at least as small as the reciprocal of its absorption constant.

7. A photodetector in accordance with claim 6 further comprising a transparent electrode formed on the surface of said semiconductor body opposing said barrier layer.

8. A photodetector in accordance with claim 6 in which said body of P-type semiconductor material is formed of tellurium and said barrier layer is formed of $Al_2O_3$.

References Cited

UNITED STATES PATENTS

| | | | |
|---|---|---|---|
| 3,267,317 | 8/1966 | Fischer | 317—235.27 |
| 3,281,714 | 10/1966 | Haering et al. | 317—235.27 |
| 3,329,823 | 7/1967 | Handy et al. | |
| 3,353,114 | 11/1967 | Hanks et al. | 317—235.27 |

RALPH G. NILSON, Primary Examiner

T. N. GRIGSBY, Assistant Examiner

U.S. Cl. X.R.

250—217; 317—235.27